(12) United States Patent
Conboy et al.

(10) Patent No.: US 6,711,450 B1
(45) Date of Patent: Mar. 23, 2004

(54) INTEGRATION OF BUSINESS RULE PARAMETERS IN PRIORITY SETTING OF WAFER PROCESSING (75) Inventors: Michael R. Conboy, Austin, TX (US); Elfido Coss, Jr., Austin, TX (US); Jason Grover, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/496,205

(22) Filed: Feb. 2, 2000

(51) Int. Cl.[7] ............................................... G06F 19/00
(52) U.S. Cl. ........................ 700/115; 700/214; 700/215
(58) Field of Search ................................ 700/100, 104, 700/108, 109, 112, 115, 116, 121, 214, 215

(56) References Cited

U.S. PATENT DOCUMENTS

| | | | | |
|---|---|---|---|---|
| 4,887,218 A | * | 12/1989 | Natarajan | 700/102 |
| 5,231,585 A | * | 7/1993 | Kobayashi et al. | 700/96 |
| 5,325,972 A | * | 7/1994 | Prydtz et al. | 209/552 |
| 5,751,581 A | * | 5/1998 | Tau et al. | 700/115 |
| 5,778,386 A | * | 7/1998 | Lin et al. | 707/10 |
| 5,838,566 A | * | 11/1998 | Conboy et al. | 700/115 |
| 5,972,727 A | * | 10/1999 | Ryan et al. | 438/14 |
| 5,990,437 A | * | 11/1999 | Coutant et al. | 209/583 |
| 6,104,183 A | * | 8/2000 | Kobayashi et al. | 324/158.1 |
| 6,147,316 A | * | 11/2000 | Beffa | 209/573 |
| 6,240,335 B1 | * | 5/2001 | Wehrung et al. | 700/230 |
| 6,403,905 B1 | * | 6/2002 | Conboy et al. | 209/563 |
| 6,457,587 B1 | * | 10/2002 | Conboy et al. | 209/630 |

* cited by examiner

Primary Examiner—Leo Picard
Assistant Examiner—Chad Rapp

(57) ABSTRACT

A method and a system for managing the movement of material lots through a semiconductor fabrication facility. In an example embodiment of the method, the movement of the material lots is tracked and a business rules module is accessed that generates material movement directives as a function of event changes on the line and externally provided directives that change the material lot movement sequence. Material lots are then rearranged in the material handling system as a function of a carrier code and the directive indicating a change. The result is a fabrication process that is more responsive and flexible with respect to internal or external changing conditions.

20 Claims, 6 Drawing Sheets

INTEGRATION OF BUSINESS RULE PARAMETERS IN PRIORITY SETTING OF WAFER PROCESSING

FIELD OF THE INVENTION

The present invention generally relates to material movement in a manufacturing environment and, more particularly, to systems and methods for managing material movement and material to be processed in a semiconductor fabrication facility.

BACKGROUND OF THE INVENTION

Conventional manufacturing plants and processes have the task of moving material around and through the manufacturing process. Whether it is material to be used in making a product or the material itself that will be processed and turned into a product, there is a need to track the material and to control the manufacturing operation being applied to it. Further, if conditions where to change that would alter the normal schedule and processing path, it would be very difficult today to integrate such changes into the current manufacturing operation without substantial manual intervention in the process. This is further complicated when dealing with a semiconductor fabrication environment as described below.

A conventional semiconductor fabrication plant typically includes multiple fabrication areas or bays interconnected by a path, such as a conveyor belt. Each bay generally includes the requisite fabrication tools (interconnected by a subpath) to process semiconductor wafers for a particular purpose, such as photolithography, chemical-mechanical polishing, or chemical vapor deposition. Material stockers or stocking tools generally are located about the plant and store semiconductor wafers waiting to be processed. The wafers are typically stored in containers, such as cassettes, each of which can hold up to 25 wafers. The cassettes are then stored in carriers that facilitate movement throughout the plant. The carriers can move material in lots, primarily between stocking locations, such as production wafers, test wafers, or empty cassettes if necessary to ensure that the process is moving smoothly.

A material stocker typically services two or more bays and can hold hundreds of cassettes. While not shown, the semiconductor fabrication plant, including the bays, material stockers and the interconnecting path, typically operates under control of a distributed computer system running a factory management program. Another program can be implemented to track and control the movement of material in the carriers throughout the plant. A typical semiconductor fabrication plant handles the processing of thousands of wafers at any given time. The wafers are typically divided into lots that undergo different processing sequences. Most of the time the mix of material, in the form of lots, moving through the plant includes test wafers and empty cassettes that need to move into and out of the manufacturing sequence. A more detailed discussion of the movement of lots throughout a semiconductor manufacturing facility may be found in U.S. Pat. No. 5,751,581 issued May 12, 1998 to Tau et al., entitled "Material Movement Server," which is herein incorporated by reference.

When external factors force changes in the production schedule, substantial manual intervention is required to adjust the scheduled production of wafers and the movement of other material in the plant. Issues such as design/material changes, line balancing, quality control, sudden increase/decrease in demand of product, change in priority of wafer lots, or other management driven initiatives need to be integrated into the manufacturing process. However, the necessary adjustments to the production line and material movement are not readily known and usually require a substantial amount of time to execute. In view of the above, there is a need to integrate such events or integrate a high management level instruction into the production schedule without substantially disrupting the flow of material through the plant or lowering the manufacturing yield.

SUMMARY OF THE INVENTION

The present invention is directed to addressing the above, and other needs in connection with improving efficiencies of material lot movement and material processing in a semiconductor processing line.

Semiconductor fabrication facilities have material handling systems that manage production/test wafers as well as empty cassettes and carriers throughout the system. Changes to these systems have been manually coordinated by the operators on the line, which has led to delays in the system in processing the wafers or inefficiencies in manufacturing. It has been discovered that delays caused by event changes in the line or management initiatives external to the line can be reduced by integrating an appropriate business rules module into the manufacturing process. The module and system is capable of giving advanced notice of: a downstream opportunity for using manufacturing capacity that becomes available or an opportunity to reduce cycle time by rescheduling tool/equipment maintenance for a time when the line is not at its limit of capacity.

According to one aspect of the invention, a method of managing the movement of material lots through a processing facility includes tracking the movement of the material lots in the facility. The material lots are then rearranged in a material handling system as a function of a carrier code and an externally provided directive indicating a material lot movement sequence change.

According to another aspect of the invention, a method of managing the movement of material lots through a semiconductor fabrication facility includes tracking the movement of the material lots in the facility. A business rules module arrangement is accessed that generates material movement directives as a function of event changes on the line. Any externally provided directives in the business rules module are reviewed that can change the movement of material lots in a material handling system. The material lots in the material handling system are then rearranged as a function of a carrier code and the directive indicating a material lot movement sequence change.

In yet another aspect of the invention, a system for managing the movement of material lots through a processing facility includes a tracking arrangement that tracks the movement of the material lots in the facility. The material lots are rearranged in a material handling system as a function of a carrier code and an externally provided directive indicating a material lot movement sequence change.

In yet another aspect of the invention, a system for managing the movement of material lots through a semiconductor fabrication includes a material handling system adapted to move and track the movement of material lots in the facility. A business rule module coupled to the material handling system is adapted to rearrange the material lots as a function of a carrier code and an externally provided directive indicating a material lot movement sequence change.

The above summary of the present invention is not intended to describe each illustrated embodiment or every implementation of the present invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally directed to a method and system for managing the movement of material lots in a manufacturing environment, particularly where an automated material handling system is used. The invention is particularly suited for managing production/test wafers and empty cassettes in a semiconductor fabrication facility. While the present invention is not so limited, a better understanding of the invention will be found by reading the detailed description and exemplary embodiments that follow. Moreover, while the exemplary embodiment relates to a semiconductor facility processing wafers, it should be appreciated that the invention is not so limited.

In an example embodiment, a method of managing the movement of material lots through a semiconductor fabrication facility includes tracking the movement of the material lots in the facility. A business rules module arrangement is then accessed that generates material movement directives as a function of event changes on the line and any externally provided directives therein are reviewed that change the movement of material lots in a material handling system. A management input module is then accessed that generates directives on material lot movements in connection with management input. The material lots affected by the instructions in the business rules module are then identified and instructions communicated to the material handling system. The material lots in the material handling system are then rearranged as a function of a carrier code and the directive indicating a material lot movement sequence change.

Figure 1:
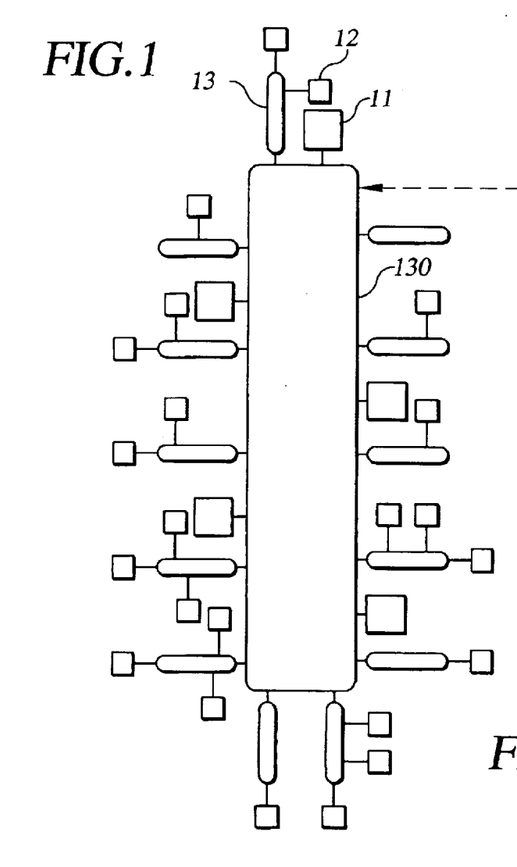
FIGS. 1–1A illustrates an exemplary semiconductor fabrication facility in accordance with one embodiment of the invention.
Figure 1A:
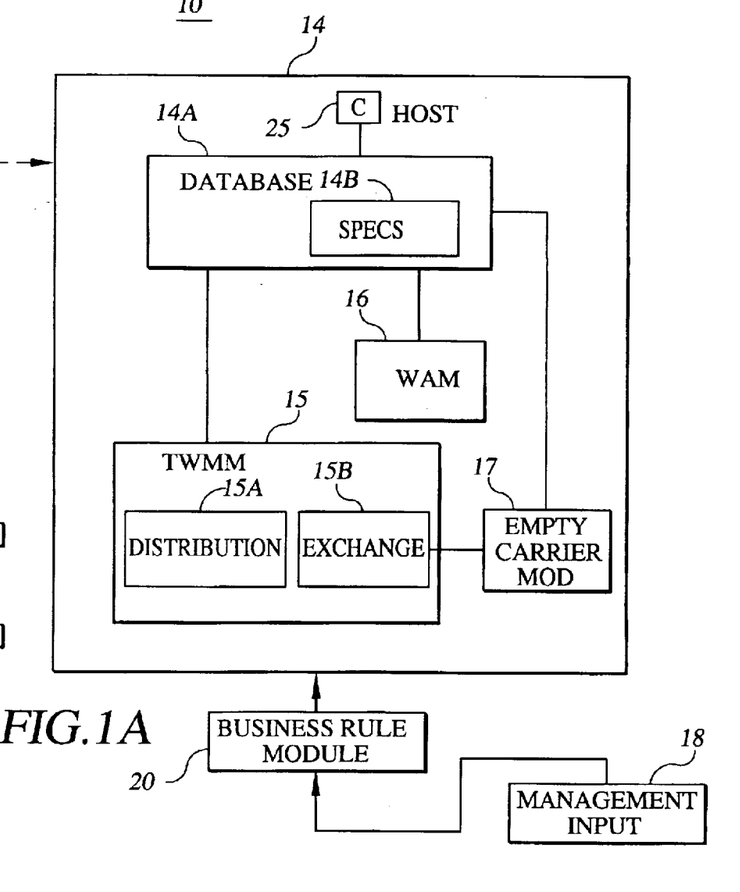

Referring now to the figures, in FIG. 1A an example embodiment of semiconductor fabrication facility 10 includes multiple stocking tools or stockers 11 and multiple fabrication tools 12 and an automated material handling system for moving material lots (e.g., wafers, empty cassettes, etc.) between the tools. The automated material handling system includes one or more paths 13 interconnecting the tools and a host system 14 that controls the movement of material lots within the facility. The host system 14 is a distributed computer system running a factory management program. The fabrication and stocker tools and path(s) each typically include or are associated with a computer system which locally controls the operation of the tool or path and which communicates with the host system 14.

A number of different fabrication tools may be provided for fabricating wafers. While not exhaustive, such fabrication tools include deposition chambers, polishing tools, and photolithography tools. The facility processes a number of wafers, including production wafers and test wafers, and includes a number of carriers and cassettes for storing wafers processed in the facility. During processing, production wafers are divided into lots of one or more wafers. Each carrier, cassette, wafer lot or material lot is identified and tracked by an identification tag, such as a bar code, which is read by each tool and sensors along the path.

The host system 14 includes a computer arrangement that has data storage capabilities, such as a database 14A, for storing information pertaining to the fabrication process. The database 14A may reside on host system 14 as shown or, alternatively, may reside on a separate system. The database 14A stores the number of wafer lots being started at a particular time, the time of each wafer start, and the associated process sequence specification 14B for each wafer start. The sequence for each process in specification 14B details a series of process steps under which a wafer lot undergoes during fabrication. A number of different process sequence specifications are in operation at a given time and host system 14 accesses the specification(s) 14B to manage the flow of wafers within the facility. As should be appreciated, a given wafer lot undergoes a number of events during its fabrication sequence. Such events include, for example, dopant implants, various dielectric and metal deposition steps, polishing steps, storage in stockers, transfers between cassettes and so forth.

The host system 14 further includes a wafer attribute module (WAM) 16 which manages attributes of wafers as they move through their fabrication sequence. WAM 16 stores and updates attributes of wafers as they undergo events during fabrication. A more detailed discussion of wafer attribute management is found in co-pending application Ser. No. 09/193,349, now U.S. Pat. No. 6,449,522, entitled "Managing a Semiconductor Fabrication Facility Using Wafer Lot and Cassette Attributes," filed Nov. 17, 1998, which is herein incorporated by reference.

The host system 14 further includes a wafer management module 15 for managing wafers in the facility. Wafer management module 15, in the exemplary embodiment, includes a distribution module lSA, having access to the process sequence specifications 14A, for handling distribution of wafers in cassettes and an exchange module 15B which handles wafer exchanges between cassettes and the various tools around the facility. An empty carrier module 17 is included coupled to wafer module 15 to coordinate use and need of empty carriers in the system. A controller 25, within host system 14 and coupled to database 14A, is included for pre-positioning material on the line. A more detailed discussion of pre-positioning material on the wafer processing line is found in co-pending application "Real Time Decision Making System for Reduction of Time Delays in an Automated Material Handling System," filed on Aug. 31, 1999, having Ser. No. 09/387,175, now U.S. Pat. No. 6,308,107, which is herein incorporated by reference.

The host system 14 and modules 15 and 16 may be implemented in a number of different ways. The implementation of the modules as a subcomponent of the host system 14 is provided by way of illustration only. The modules 15 and 16 may, alternatively, be implemented as stand alone modules that interface with the host system 14. One skilled in the art upon reading the present description will readily understand a number of other implementation techniques. A more detailed discussion of the operation of these modules within the wafer processing line is found in co-pending application "Managing Test Material in an Automated Material Handling System", also filed on Aug. 31, 1999 having Ser. No. 09/387,613, now U.S. Pat. No. 6,338,005, which is herein incorporated by reference.

Referring to FIG. 1A, a management-input module 18 is coupled to host system 14 through a business rule module 20. Business rule module 20 is communicatively coupled to host system 14. The business rule and the management input modules will be discussed in further detail later in the specification. In short, module 20 includes business rules parameters that are associated with the characteristics of a material lot, with a defined set of products, with an event change on the line or with an operational step. The business rules parameters are tied closely with management input (goals or directives) that need to be integrated into the production system in such a manner as to give the production system more flexibility in responding to changing market conditions. Once management has issued a directive, the business rules module issues instructions to the remaining parts of the production system. The business rules module has incorporated therein the limitations of the material handling system and, accordingly, issues instructions on the type of adjustments that have to be made on the production line that will satisfy the directive.

Figure 1B:
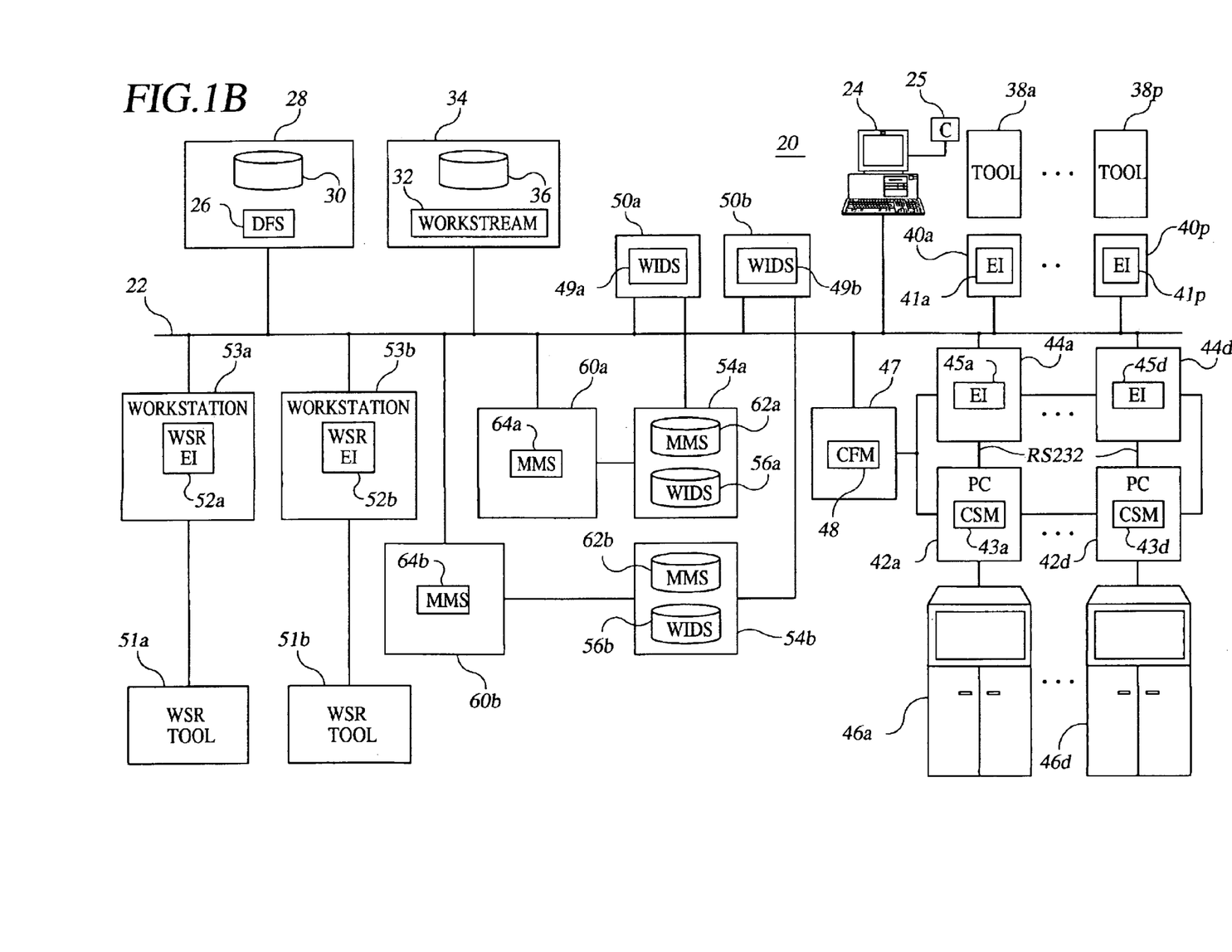
FIG. 1B is a schematic diagram depicting the architecture of a control system for the fabrication of integrated circuits.

Referring briefly to the architecture of the control system, FIG. 1B refers generally to a control system 20 for the fabrication of integrated circuits on semiconductor wafers. Control system 20 has a central bus 22 to which the various control elements are coupled. The language, or protocol used on the bus 22 is called ISIS and is sold by ISIS Distributed Systems. A personal computer 24 is coupled to the bus 22 for ad hoc access to all movement functions for the cassettes and wafers. The controller/dispatcher 25, which is coupled to control system 20 and to computer 24, functions to pre-position material in the process in anticipation of the next process step to reduce transportation time delays.

Figure 2:
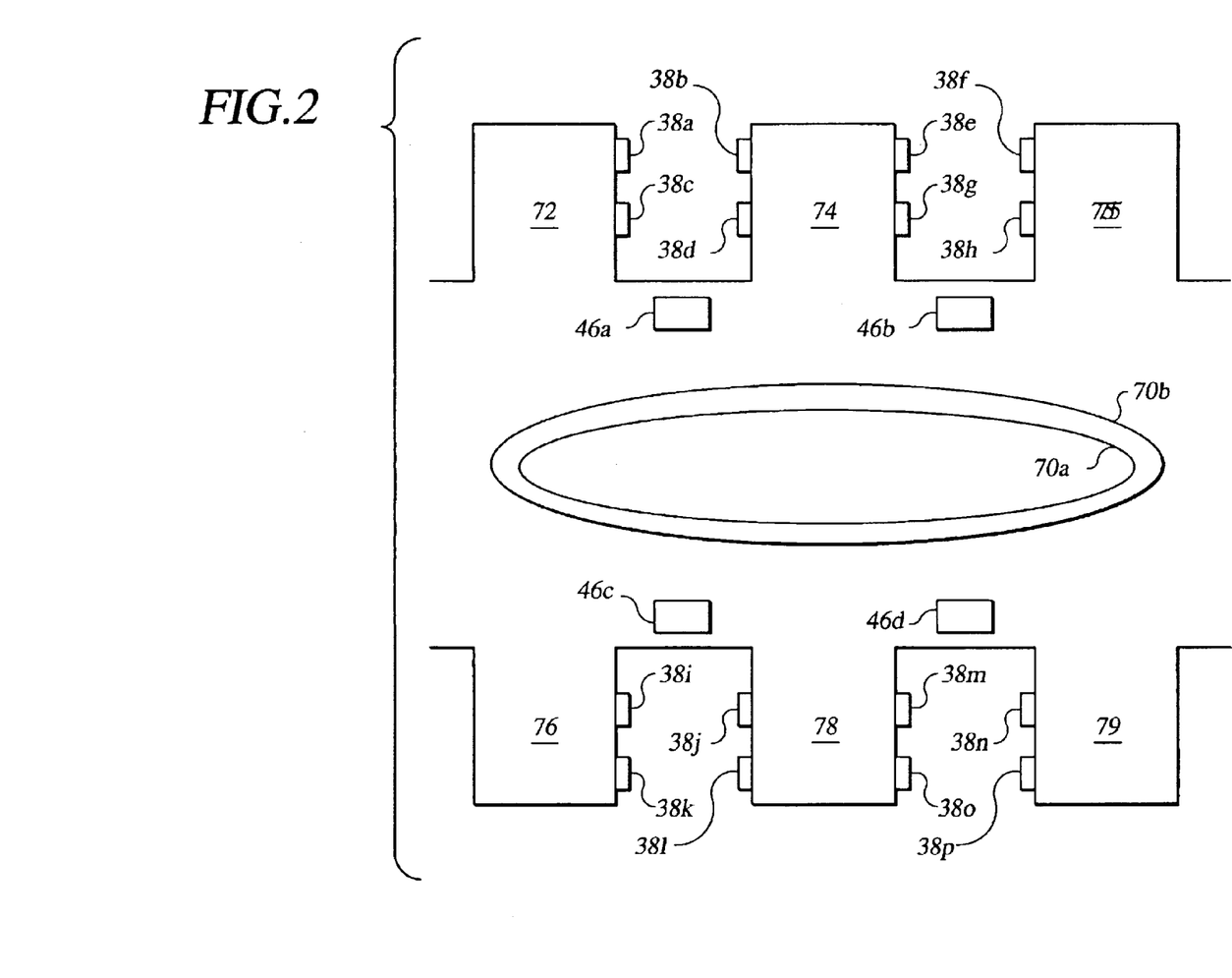
FIG. 2 is a schematic diagram showing the physical layout of a shop floor.

Referring briefly to FIG. 2, in a schematic of the shop floor there is included monorails 70a and 70b that move carriers with material lots, which may include cassettes, to and from material stockers 46a–d. Manufacturing tools 38a–38p are located about bays 72, 74, 75, 76, 78, and 79. The integration of the business rules and management-input modules into the fabrication system will have an affect on how carriers move material lots from one bay to the next or the diversion of a material lot (such as a wafer lot) to a different tool.

Figure 3:
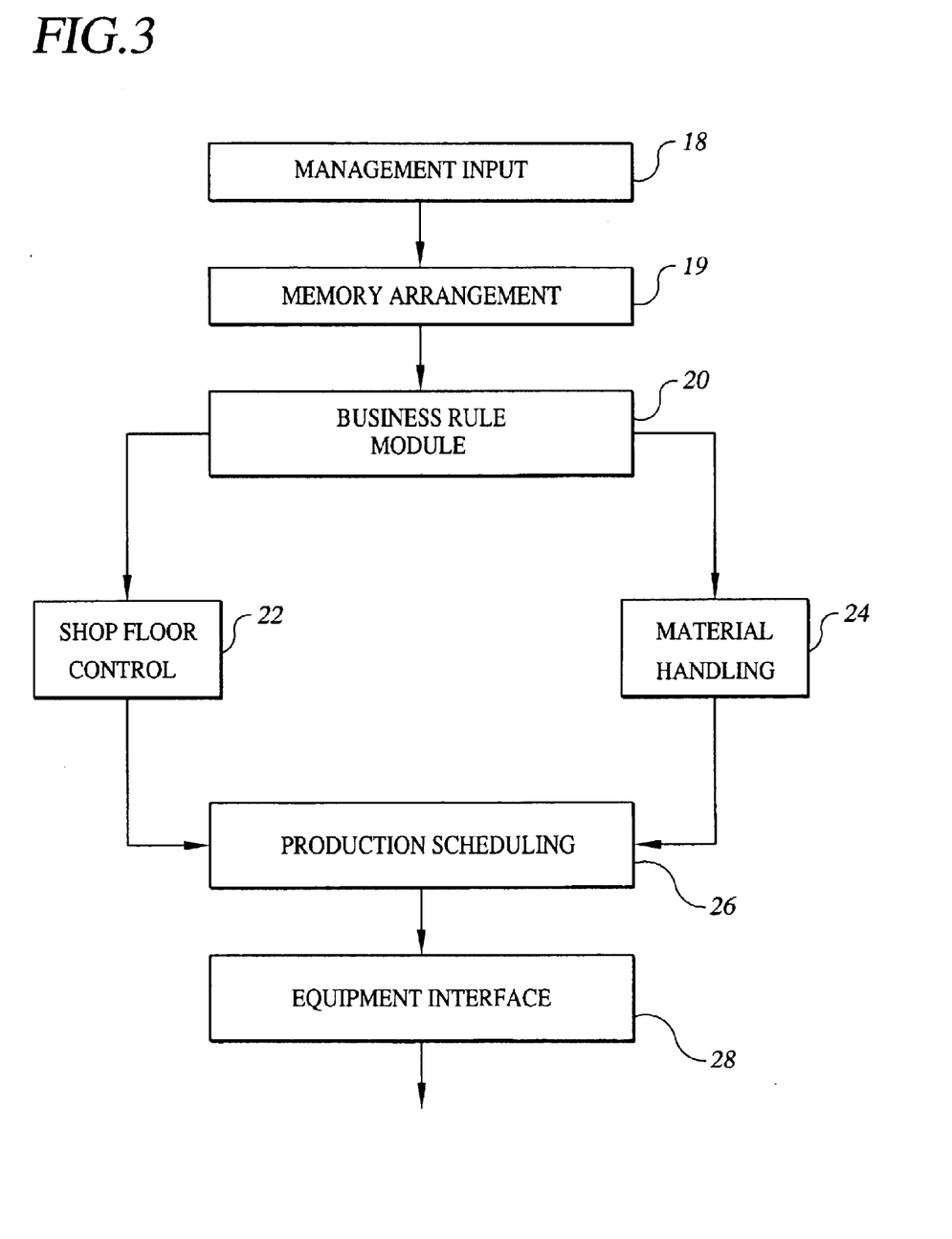
FIG. 3 is a schematic of an example method of managing material lots in a manufacturing facility that includes a business rule module coupled to the material handling system and the shop floor control system.
Figure 4:
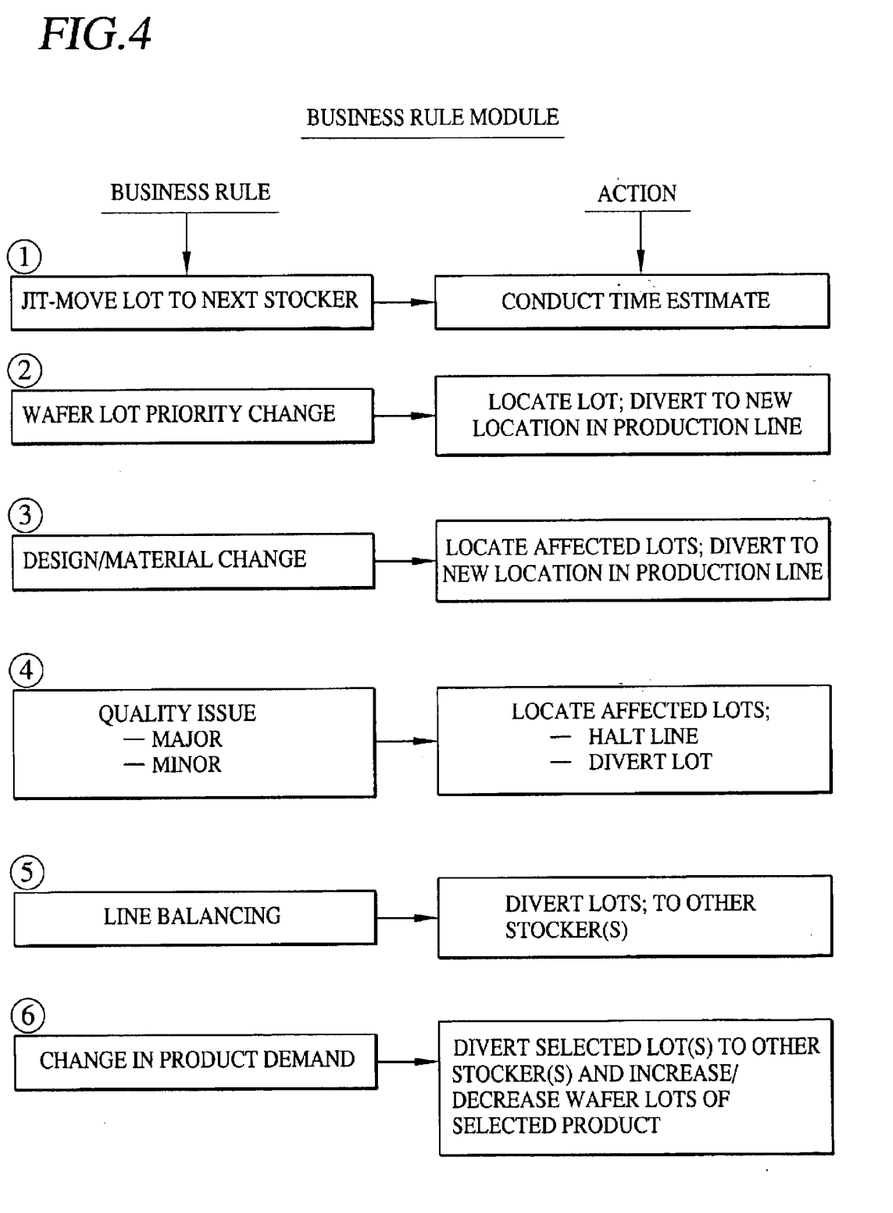
FIG. 4 is a table that includes examples of business rule parameters and corresponding action/instructions that alter material lot movement in the production line.
Figure 5:
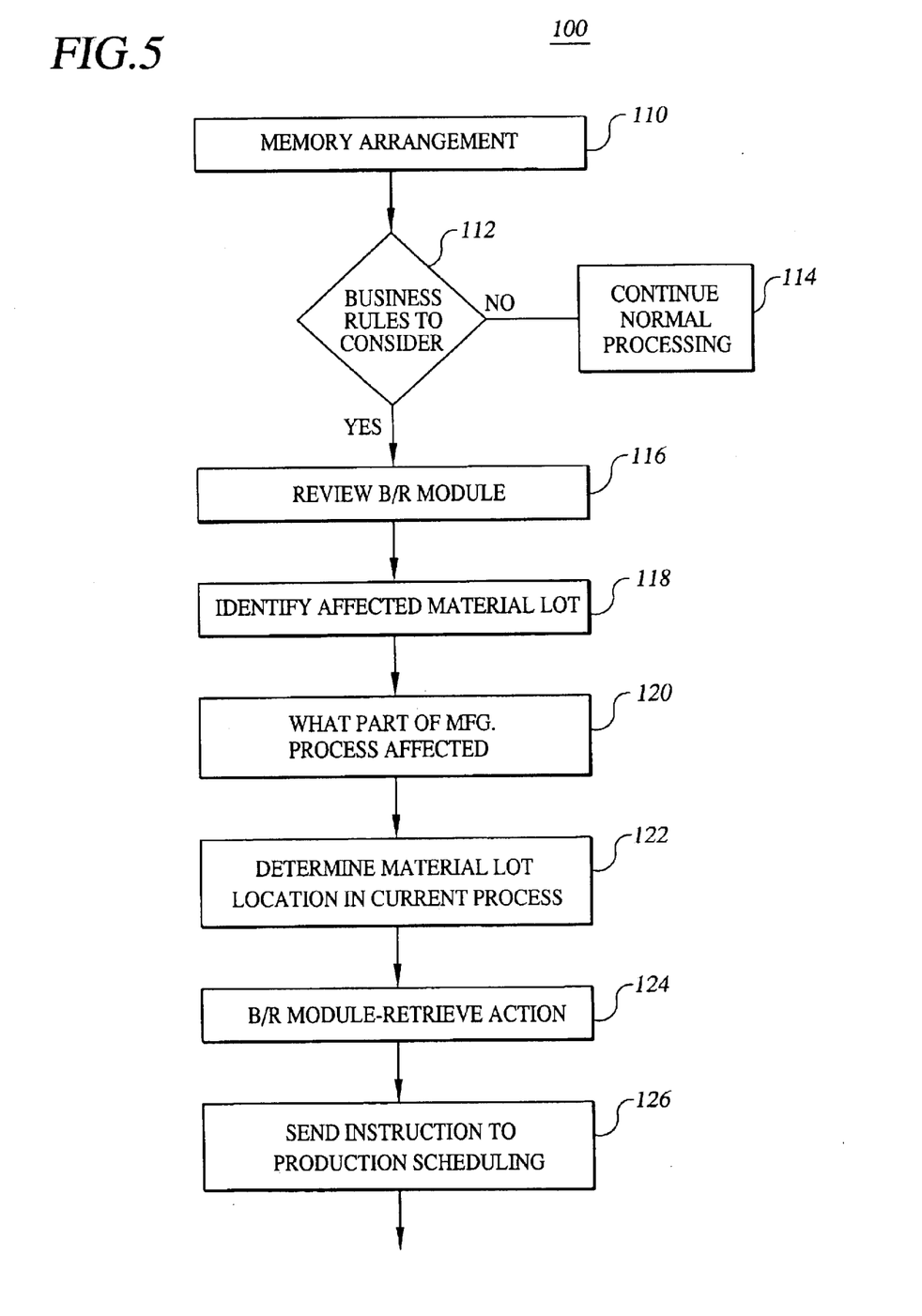
FIG. 5 is a flowchart of the manner in which the business rule module processes information prior to executing instructions.

Referring to FIGS. 3–5, FIG. 3 is a schematic of the integration of the management input module 18 into the manufacturing system. A memory or computer arrangement 19 is included that facilitates the input of management directives into business rules module 20. Business rules module is coupled to a shop floor (or manufacturing) control module 22 and to a material handling module 24. Shop floor control module 22 generally tracks the handling of material lots as they move through the various operations on the production line. Material handling module 24 generally tracks the physical movement of carriers and cassettes on the production line. Modules 22 and 24 are coupled to a production scheduling module 26 that is scheduling the actual processing of wafers.

Business rules parameters represent a set of conditions or instructions that are executed at different points along the production line to achieve a desired management goal or directive. Each product, event change or major operational step has a set of business rule parameters associated with them. Referring to FIG. 4, an example of a set of business rules includes, but is not limited to, issues such as: JIT (Just in Time) movement of a material lot to the next stocker on the line, change in priority of wafer lot processing and design/material changes. Each of these rules has a corresponding set of actions/instructions that will change how the production line operates. For example, the wafer priority change scenario triggers initially an action to locate the appropriate material or wafer lot and divert this lot to another part of the production line. A change in product demand initiates a diversion of selected wafer lots to other stockers on the line and could trigger an increase/decrease in wafer lots of desired product.

Another example of a business rule is cycle time reduction. In reducing cycle time, it is understood that there are a finite number of stores and stockers and a finite number of deliverables that need to be managed. It may be necessary to free up a test lot or an empty cassette or to prevent the move of another product in order to achieve the cycle time reduction sought. The system can also poll itself to detect opportunities for reducing cycle time, such as suggesting that a scheduled maintenance be delayed long enough to process some urgently needed product. Options such as: hold and wait, call on demand, store and forward or forward and store may also be available to improve on cycle time.

Referring to FIG. 5, flowchart 100 illustrates an example set of the steps that business rule module 20 follows before issuing any instruction that changes the normal course of production. The memory arrangement 1 10, which is coupled to host system 14 and incorporates any management input or objective that is currently active, is first accessed. The system then inquires at 112 if there are any business rules to consider based on any management directive or event change on the line. If there is not, the line will continue processing as normal at 114. If there is a business rule to consider, then the business rule module is reviewed at 116. At 118, an identification of an affected material lot is made and at 120 a determination is made as to what part of the manufacturing process is affected by the business rule in effect. A determination is then made of the location of the material lot(s) in question in the current process at 122. A material lot may include a product such as a production wafer, a test wafer, an empty cassette or any other material moved around the facility. The business rules module is then accessed at 124 to retrieve the action/instruction(s) corresponding to the business rule. At 126 the instruction(s) is forwarded to the production scheduling module or the shop control module or the material handling module. This may include communicating instructions to equipment interfaces that communicate with material stocking locations, located throughout the semiconductor fabrication facility.

The business rules module is capable of generating manufacturing instructions for defined products or certain operational steps or instructions to divert material lots to other areas in response to an event change on the line or external to the line. The business rules module can also be equipped with polling capabilities in order to poll the material handling system and the shop floor control system at defined time intervals to look for opportunities to improve manufacturing efficiency. This may include reducing cycle time by reducing the number of process steps in moving material lots into or out of the manufacturing process or by adjusting equipment/tool preventive maintenance schedules.

As noted above, the present invention is applicable to a number of techniques for managing the movement of material lots in a material handling system. Accordingly, the present invention should not be considered limited to the particular examples described above, but rather should be understood to cover all aspects of the invention as fairly set out in the attached claims. For instance, while the movement of material lots (including wafers and empty cassettes, for instance) in a material handling system of a semiconductor facility is illustrated, the invention extends to cover the management of other materials and material lots in different environments. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method of managing the movement of material lots through a processing facility, the method comprising:
   tracking the movement of the material lots in the facility; and
   rearranging the material lots in a material handling system as a function of a carrier code, data fed back from the material handling system, and an externally provided directive indicating a material lot movement sequence change.

2. The method of claim 1, further including the steps of:
   identifying the material lots affected by the directive; and
   communicating instructions, pursuant to a directive, to the material handling system that there is a change to the material lot movement sequence before the step of rearranging the material lots.

3. The method of claim 1, after the step of tracking the material lot movement further including the step of accessing a business rules module arrangement that generates material movement instructions associated with a group consisting of: a defined set of products, a defined operational process and an event that occurs a material lot movement path.

4. The method of claim 3, wherein accessing the business rules module includes the step of accessing a management input module arrangement and reviewing any directives therein that change the movement of material lots.

5. A method of managing the movement of material lots through a processing facility, the method comprising:
   tracking the movement of the material lots in the facility;
   accessing a business rules module arrangement that generates material movement instructions associated with a group consisting of: a defined set of products, a defined operational process and an event that occurs in a material lot movement path, including accessing a management input module arrangement and reviewing any directives therein that change the movement of material lots;
   rearranging the material lots in a material handling system as a function of a carrier code and an externally provided directive indicating a material lot movement sequence change; and
   polling the material handling system at defined time intervals to reduce cycle time process steps in moving material lots into or out of a manufacturing process.

6. The method of claim 1, further including the step of using a computer arrangement for tracking the material lot movement and controlling the rearrangement of material lots in the material handling system.

7. A method of managing the movement of material lots through a semiconductor fabrication facility, comprising:
   tracking the movement of the material lots in the facility;
   accessing a business rules module arrangement that generates material movement directives as a function of event changes and reviewing any externally provided directives therein that change the movement of material lots in a material handling system; and
   rearranging the material lots in the material handling system as a function of a carrier code, data feel back from the material handling system, and the directive indicating a material lot movement sequence change.

8. The method of claim 7, before the step of rearranging the material lots, further including the steps of:
   accessing a management input module that generates directives on material lot movements in connection with management input;
   identifying material lots affected by instructions in the business rule module; and
   communicating instructions to the material handling system that there is a change to the material lot movement sequence.

9. The method of claim 8, wherein the step of communicating instructions to the material handling system includes sending instructions to equipment interfaces that communicate with material stocking locations.

10. The method of claim 7, wherein the material lots include items selected from a group consisting of: production wafers, test wafers and empty cassettes.

11. The method of claim 10, wherein the business rule module generates manufacturing instructions for certain operational steps in a manufacturing process.

12. A method of managing the movement of material lots through a semiconductor fabrication facility, comprising:
   tracking the movement of the material lots in the facility;
   accessing a business rules module arrangement that generates material movement directive as a function of event changes and reviewing any externally provided directives therein that change the movement of material lots in a material handling system;
   rearranging the material lots in the material handling system as a function of a carrier code and the directive indicating a material lot movement sequence change; and
   polling the material handling system at defined time intervals to reduce cycle time process steps in moving material lots into or out of a manufacturing process.

13. The method of claim 7, further including the step of using a computer arrangement for tracking the material lot movement and controlling the rearrangement of material lots in the material handling system.

14. A system for managing the movement of material lots through a processing facility, the method comprising:
   means for tracking the movement of the material lots in the facility; and means for rearranging the material lots in a material handling system as a function of a carrier code, data fed back from the material handling system, arid an externally provided directive indicating a material lot movement sequence change.

15. A system for managing the movement of material lots through a semiconductor fabrication, comprising:

a material handling system adapted to move and track the movement of material lots in a facility; and a business rule module coupled to the material handling system that is adapted to rearrange the material lots as a function of a carrier code, data fed back from the material handling system, and an externally provided directive indicating a material lot movement sequence change.

16. The system of claim 15, further including a computer arrangement that integrates a management input module into the business rule module, the computer arrangement coupled to the business module.

17. The system of claim 15, wherein the material lots include products that are selected from a group consisting of: production wafers, test wafers and empty cassettes.

18. The system of claim 15, wherein the business rule module generates material lot movement instructions associated with a defined set of products.

19. A system for managing the movement of material lots through a semiconductor fabrication, comprising:

a material handling system adapted to move and track the movement of material lots in a facility;

business rule module coupled to the material handling system that is adapted to rearrange the material lots as a function of a carrier code and an externally provided directive indicating a material lot movement sequence change; and a computer arrangement that integrates a management input module into the business rule module, the computer arrangement coupled to the business module; and means for polling the material handling system at defined time intervals to reduce cycle time by reducing process steps in moving material lots into or out of a manufacturing process.

20. The system of claim 16, wherein the computer arrangement tracks the material lot movement and controls the rearrangement of material lots in the material handling system.

* * * * *

UNITED STATES PATENT AND TRADEMARK OFFICE
CERTIFICATE OF CORRECTION

PATENT NO. : 6,711,450 B1
DATED : March 23, 2004
INVENTOR(S) : Conboy et al.

Page 1 of 1

It is certified that error appears in the above-identified patent and that said Letters Patent is hereby corrected as shown below:

<u>Column 4,</u>
Line 62, "ISA" should read -- 15A --.

<u>Column 8,</u>
Line 21, "feel" should read -- fed --.

<u>Column 9,</u>
Line 3, "arid" should read -- and --.

Signed and Sealed this

First Day of June, 2004

JON W. DUDAS
*Acting Director of the United States Patent and Trademark Office*